US009802275B2

(12) United States Patent
Ribas et al.

(10) Patent No.: US 9,802,275 B2
(45) Date of Patent: Oct. 31, 2017

(54) ROSIN-FREE THERMOSETTING FLUX FORMULATIONS

(71) Applicant: Alpha Assembly Solutions Inc., Waterbury, CT (US)

(72) Inventors: Morgana de Avila Ribas, Bangalore (IN); Rahul Raut, Edison, NJ (US); Traian Cornel Cucu, South Plainfield, NJ (US); Shu Tai Yong, Singapore (SG); Siuli Sarkar, Bangalore (IN); Ramakrishna Hosur Katagiriyappa, Bangalore (IN)

(*) Notice: Subject to any disclaimer, the term of this patent is extended or adjusted under 35 U.S.C. 154(b) by 0 days.

(21) Appl. No.: 15/109,352

(22) PCT Filed: Dec. 31, 2014

(86) PCT No.: PCT/US2014/072936
§ 371 (c)(1),
(2) Date: Jun. 30, 2016

(87) PCT Pub. No.: WO2015/103362
PCT Pub. Date: Jul. 9, 2015

(65) Prior Publication Data
US 2016/0318134 A1 Nov. 3, 2016

Related U.S. Application Data

(60) Provisional application No. 61/922,130, filed on Dec. 31, 2013.

(51) Int. Cl.
*H05K 1/09* (2006.01)
*B23K 35/362* (2006.01)
(Continued)

(52) U.S. Cl.
CPC .......... *B23K 35/362* (2013.01); *B23K 35/025* (2013.01); *B23K 35/262* (2013.01);
(Continued)

(58) Field of Classification Search
CPC ............ H05K 1/09; H05K 1/11; B32B 15/04; B23K 35/02; B23K 35/26; B23K 35/36; B23K 35/362; C08L 83/08
(Continued)

(56) References Cited

U.S. PATENT DOCUMENTS

| 5,088,189 A | 2/1992 | Brown |
| 5,904,782 A | 5/1999 | Diep-Quang |

(Continued)

FOREIGN PATENT DOCUMENTS

| JP | 2002514973 | 5/2002 |
| JP | 2012245529 | 3/2012 |

(Continued)

*Primary Examiner* — Xiaoliang Chen
(74) *Attorney, Agent, or Firm* — Carmody Torrance Sandak & Hennessey LLP

(57) ABSTRACT

Rosin-free thermosetting flux formulations for enhancing the mechanical reliability of solder joints. In accordance with one or more aspects, a solder paste as shown and described herein imparts improved or enhanced solder joint properties relating to at least one of drop shock, thermal cycling, thermal shock, shear strength, flexural strength performance, and/or other thermal-mechanical performance attributes.

28 Claims, 10 Drawing Sheets

(51) Int. Cl.
    *B23K 35/26*     (2006.01)
    *B23K 35/36*     (2006.01)
    *B23K 35/02*     (2006.01)
    *H05K 1/11*     (2006.01)
    *H05K 9/00*     (2006.01)

(52) U.S. Cl.
    CPC ........... *B23K 35/3612* (2013.01); *H05K 1/09* (2013.01); *H05K 1/111* (2013.01); *H05K 9/0024* (2013.01); *H05K 2201/032* (2013.01)

(58) Field of Classification Search
    USPC .......................... 174/257; 428/457; 524/451
    See application file for complete search history.

(56) References Cited

U.S. PATENT DOCUMENTS

| | | | |
|---|---|---|---|
| 9,643,285 B2 | 5/2017 | Ganbe et al. | |
| 2008/0053571 A1* | 3/2008 | Yamamoto | B23K 35/0244 148/23 |
| 2008/0073414 A1* | 3/2008 | Saito | B23K 1/0016 228/244 |
| 2010/0035072 A1* | 2/2010 | Watanabe | B22F 1/0059 428/457 |
| 2014/0083567 A1 | 3/2014 | Hamagawa et al. | |
| 2014/0200303 A1* | 7/2014 | Steendam | C08L 69/00 |

FOREIGN PATENT DOCUMENTS

| | | |
|---|---|---|
| JP | 2012072211 | 4/2012 |
| JP | 2013043931 | 3/2013 |
| WO | 2013191121 | 12/2013 |

\* cited by examiner

ROSIN-FREE THERMOSETTING FLUX FORMULATIONS

FIELD OF THE TECHNOLOGY

One or more embodiments relate generally to flux formulations and, more specifically, to rosin-free thermosetting flux formulations.

BACKGROUND

With recent advances, the size of electronic components has been reduced which presents challenges for soldering operations. For example, due to the reduction in size, an adequate amount of solder may not be used and the strength of resulting solder joints may be insufficient to hold or secure components to a printed circuit board.

SUMMARY

In accordance with one or more aspects, a solder paste as shown and described herein imparts improved or enhanced solder joint properties relating to at least one of drop shock, thermal cycling, thermal shock, shear strength, flexural strength performance, and/or other thermal-mechanical performance attributes.

In accordance with one or more aspects, a flux for an epoxy solder paste may comprise of: 20 to 40% by weight organic high-boiling solvent; 5 to 15% by weight multifunctional type epoxy resin; 15 to 30% by weight epoxy resin with high molecular weight; 15 to 30% by weight phenolic group containing hardening agent; 2 to 6% by weight anhydride based liquid hardener; 10 to 20% by weight carboxylic acid as an activator; 2 to 8% by weight substituted aromatic amine as catalyst; 1 to 5% by weight phosphene based salt as catalyst; 0.1 to 2% by weight amide based catalyst; 0.1 to 2% by weight bonding agent 0.1-2 wt %; and 0.1 to 4% by weight liquid type stress modifier.

In accordance with one or more aspects, an epoxy solder paste may comprise the above described flux and an alloy. In some aspects, the alloy may comprise 30 to 65% by weight bismuth, and balance tin, together with unavoidable impurities. The alloy may further include one or more of silver, gold, chromium, indium, phosphorous, copper, cobalt, germanium, zinc, manganese, nickel, titanium, gallium, iron, antimony, aluminum, tellurium, selenium, calcium, vanadium, molybdenum, platinum, and magnesium. In some specific aspects, the alloy may further include 0.01 to 10% by weight silver, and 0.01 to 10% by weight copper. In some aspects, the alloy may include one or more of the following: 0.001 to 1% by weight cobalt; 0.001 to 1% by weight nickel; 0.001 to 3% by weight indium; 0.001 to 4% by weight antimony; 0.001 to 1% by weight titanium; 0.001 to 3% by weight gallium; 0.001 to 1% by weight manganese; 0.001 to 1% by weight germanium; 0.001 to 1% by weight zinc; 0.001 to 1% by weight iron; 0.001 to 1% by weight gold; 0.001 to 1% by weight chromium; 0.001 to 1% by weight phosphorous; 0.001 to 1% by weight aluminum; 0.001 to 1% by weight tellurium; 0.001 to 1% by weight selenium; 0.001 to 1% by weight calcium; 0.001 to 1% by weight vanadium; 0.001 to 1% by weight molybdenum; 0.001 to 1% by weight platinum; 0.001 to 1% by weight magnesium; and 0.001 to 1% by weight rare earths.

In some aspects, the alloy is configured to reflow at a soldering temperature below 200° C. For example, the alloy may be configured to reflow at a soldering temperature between 118° C. and 200° C. In some specific embodiments, the alloy may be configured to reflow at a soldering temperature between 170° C. and 200° C. In some specific embodiments, the alloy may be configured to reflow at a soldering temperature between 240° C. and 280° C.

In some aspects, a solder joint is formed with an epoxy solder paste as shown and described herein. In other aspects, a method of forming a solder joint is disclosed using the epoxy solder paste described herein.

In at least some aspects, an assembly comprises a printed circuit board, a shield can, and a solder joint formed between the printed circuit board and the shield can, wherein the solder joint is formed by an epoxy solder paste comprising the flux set forth herein and an alloy. The printed solder board may further comprise a copper pad. The assembly may further comprise intermetallic compounds formed at an interface between the solder joint and the shield can and between the solder joint and the copper pad. In some aspects, the assembly is configured to withstand at least 900 drops in a drop shock test performed under a variation of the JESD22-B111 standard in which BGA components are replaced by shield cans.

Still other aspects, embodiments, and advantages of these example aspects and embodiments are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention and are not intended as a definition of the limits of the invention. For purposes of clarity, not every component may be labeled in every drawing. In the following description, various embodiments of the present invention are described with reference to the following drawings, in which.

DETAILED DESCRIPTION

Figure 1:
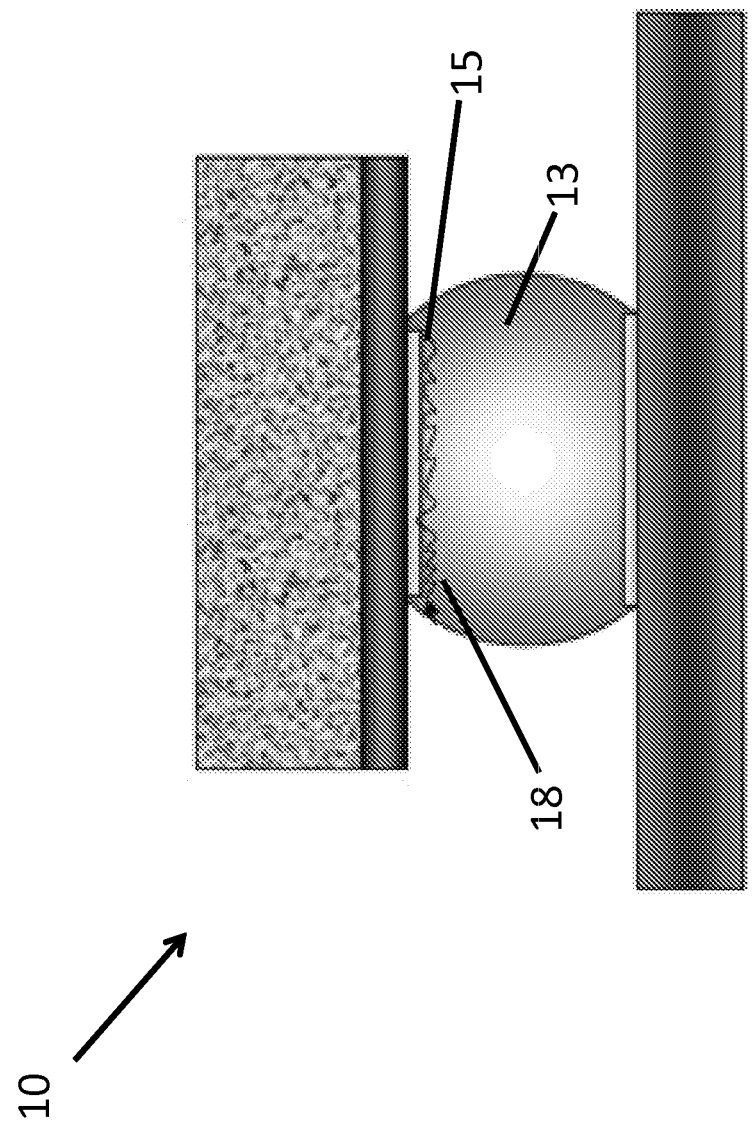
FIG. 1 is a schematic representation of a conventional solder joint formed between a printed circuit board and an electronic component.

Handheld devices, cell phones, tablets and wearables are common examples of temperature-sensitive applications that can benefit from using low temperature solder alloys. The electronic circuits responsible for the functionality of these applications are configured via printed circuit boards (PCBs). Shielding cans are often used in handheld devices, cell phones, tablets and wearables to prevent electromagnetic interference from obstructing or degrading their signal.

In accordance with one or more embodiments, the mechanical reliability of solder joints may be enhanced to impart strength and the ability to withstand various environmental stresses. Improved strength of the solder joint is an effect of cross-linking (i.e., bonds between polymer chains) and physical protection of the joint due to an epoxy solder collar formed around the alloy. Applications for the disclosed soldering technologies may be found, for example, in the manufacture of portable handheld devices and other electronics products.

In accordance with one or more embodiments, a thermosetting cross-linkable epoxy resin may be incorporated into the flux formulation of a solder paste to create a solid three-dimensional cross-linking structure around a solder joint after reflow. A flux with thermosetting curable resin may firmly strengthen electronic solder joints by hardening of the thermosetting polymer during soldering.

In accordance with one or more embodiments, the cross-linking structure may protect the solder joint by absorbing stress or directing the stress away from the solder joint to bulk solder. In turn, the epoxy flux may enhance the mechanical reliability of the solder joint. In some embodiments, a cross-linkable thermosetting polymer resin may be combined with one or more other components, such as a hardener and a catalyst, to form a three-dimensional cross-linking networked structure.

In accordance with one or more embodiments, the cross-linked thermosetting polymer may hold the solder joint by providing a polymer collar. The formed polymer collar may generally protect the solder joint and also enhance the mechanical reliability of the solder joint.

In accordance with one or more embodiments, improved mechanical properties may be achieved by combining a specific alloy composition with a specific epoxy flux formulation. Addition of epoxy flux to the solder paste results in improved adhesion between the solder and substrate.

In accordance with one or more embodiments, an epoxy solder paste may comprise a solder alloy and an epoxy flux. The epoxy solder paste may comprise a resin curing system comprising different functional epoxy resins, a phenolic hardener and a catalyst to promote the curing reaction. The type of epoxy used may be solid or liquid type, and the stoichiometric ratio of hardener and catalyst is formulated for improved performance.

In accordance with one or more embodiments, the epoxy flux may be used in conjunction with any of a low temperature, medium temperature, and high temperature solder alloy to improve mechanical properties and mechanical reliability of the produced solder joint, as manifested through, for example, drop shock, thermal cycling/shock, shear strength and flexural strength performance, as well other thermal-mechanical performance attributes. The use of the epoxy flux in conjunction with a solder alloy may reduce voids in the solder joint, spatter, and volatile organic compound production. Furthermore, use of the epoxy paste may result in protection of the joint from the environment and is compatible with other epoxy based underfills, adhesives and other electronic grade polymers.

In at least some embodiments, the alloy may be a lead-free solder alloy. In at least some embodiments, the thermosetting flux is a substantially rosin-free thermosetting flux.

In accordance with one or more embodiments, the solder alloy may be a low temperature solder alloy. The use of low temperature solder alloys may reduce energy costs, allow for the use of low temperature compatible components, or improve assembly of temperature-sensitive applications. Low temperature alloys may be used in reflow soldering at temperatures from 140 to 200° C., resulting in lower thermal stresses and defects such as warping during assembly. Eutectic Sn—Bi (melting point 138° C.) and Sn—In (melting point 118° C.) are examples of such low temperature solder alloys. Use of bismuth-based solder alloys without the disclosed epoxy flux may result in drawbacks such as brittleness, poor thermal conductivity, poor fatigue life, and poor resistance to shock and vibration. For some non-limiting low temperature applications, the alloy may comprise 30 to 65% wt Bi, one or more of Ag, Au, Cr, In, P, Cu, Zn, Co, Ge, Mn, Ni, Ti, Ga, Fe, Sb, Al, Te, Se, Ca, V, Mo, Pt, Mg, rare earths and the balance Sn, together with any unavoidable impurities. In accordance with one or more specific embodiments, the alloy may comprise 30 to 65% wt Bi, one or more of 0.01 to 10% Ag, 0.01 to 10% Cu, 0.001 to 1 wt % Co, 0.001 to 1 wt % Ni, and 0.001 to 3 wt % In, 0.001 to 4 wt % Sb, 0.001 to 1 wt % Ti, 0.001 to 3 wt % Ga, 0.001 to 1 wt % Mn, 0.001 to 1 wt % Ge, 0.001 to 1 wt % Zn, 0.001 to 1 wt % Fe, 0.001 to 1 wt % Au, 0.001 to 1 wt % Cr, 0.001 to 1 wt % P, 0.001 to 1 wt % Al, 0.001 to 1 wt % Te, 0.001 to 1 wt % Se, 0.001 to 1 wt % Ca, 0.001 to 1 wt % V, 0.001 to 1 wt % Mo, 0.001 to 1 wt % Pt, 0.001 to 1 wt % Mg, 0.001 to 1 wt % rare earths and the balance Sn, together with unavoidable impurities.

In accordance with one or more embodiments, the solder alloy may be a medium temperature solder alloy. Medium temperature solder alloys are preferred for hierarchical soldering. Such alloys may be used in reflow soldering temperatures from 200° C. to 240° C., resulting in lower thermal stresses and defects such as warping during assembly when compared with alloys with higher melting point. Indium, Bismuth or Gallium additions may be used to reduce the melting point of a Sn—Ag—Cu alloy (melting point 217-219° C.).

In accordance with one or more non-limiting embodiments for medium temperature reflow soldering, the alloy, preferably a lead-free solder alloy, may comprise 10 wt % or less silver, 10 wt. % or less bismuth, 10 wt. % or less of Indium, 10 wt. % or less of copper, one or more of Au, Cr, P, Co, Zn, Ge, Mn, Ni, Ti, Ga, Fe, Sb, Te, Al, Se, Ca, V, Mo, Pt, Mg, rare earths and the balance Sn, together with any unavoidable impurities. In accordance with one or more specific embodiments, the alloy may comprise 10 wt. % or less silver, 10 wt. % or less bismuth, 10 wt. % or less of Indium, 10 wt. % or less of copper, and one or more of 0.001 to 1 wt % Co, 0.001 to 1 wt % Ni, 0.001 to 4 wt % Sb, 0.001 to 1 wt % Ti, 0.001 to 3 wt % Ga, 0.001 to 1 wt % Mn, 0.001 to 1 wt % Ge, 0.001 to 1 wt % Zn, 0.001 to 1 wt % Fe, 0.001 to 1 wt % Au, 0.001 to 1 wt % Cr, 0.001 to 1 wt % P, 0.001 to 1 wt % Al, 0.001 to 1 wt % Te, 0.001 to 1 wt % Se, 0.001 to 1 wt % Ca, 0.001 to 1 wt % V, 0.001 to 1 wt % Mo, 0.001 to 1 wt % Pt, 0.001 to 1 wt % Mg, 0.001 to 1 wt % rare earths and the balance Sn, together with unavoidable impurities.

In accordance with one or more embodiments, the solder alloy may be a high temperature solder alloy. High temperature solder alloys are commonly used for assemblies requiring reflow soldering temperatures from 240° C. to 280° C. These alloys are Sn based and the most common, non-limiting examples are Sn—Ag, Sn—Cu and Sn—Ag—Cu systems. In accordance with one or more embodiments, a multi-functional epoxy resin may be used with a phenolic hardener which may combine with an epoxy resin during cross-linking. Generally, epoxy resin may be very reactive with respect to hardeners and catalysts. Epoxy resin tends to react with most hardening agents at room temperature and its viscosity increases as a result of cross-linking. Epoxy may generally react with acids, anhydrides, amines and phenolic salts at room temperature.

In accordance with one or more non-limiting embodiments for high temperature reflow soldering, the alloy, preferably a lead-free solder alloy, may comprise 10 wt. % or less of Ag, 10 wt. % or less of Cu, and optionally one or more of the following elements 10 wt. % or less of Bi, up to 1 wt. % of Ni, up to 1 wt. % of Ti, up to 1 wt. % of Co, up to 5 wt. % of In, up to 1 wt. % of Zn, up to 1 wt. % of As, 0 to 1 wt. % of Mn, 0 to 1 wt. % of Cr, 0 to 1 wt. % of Ge, 0 to 1 wt. % of Fe, 0 to 1 wt. % of Al, 0 to 1 wt. % of P, 0 to 1 wt. % of Au, 0 to 3 wt. % of Ga, 0 to 1 wt. % of Te, 0 to 1 wt. % of Se, 0 to 1 wt. % of Ca, 0 to 1 wt. % of V, 0 to 1 wt. % of Mo, 0 to 1 wt. % of Pt, 0 to 1 wt. % of Mg, 0 to 1 wt. % of rare earths, and the balance tin, together with any unavoidable impurities. In accordance with one or more specific embodiments, the alloy may comprise 10 wt. % or less of Ag or 10 wt. % or less of Cu and optionally one or more of the following elements 10 wt. % or less of Bi, up to 1 wt. % of Ni, up to 1 wt. % of Ti, up to 1 wt. % of Co, up to 5 wt. % of In, up to 1 wt. % of Zn, up to 1 wt. % of As, 0 to 1 wt. % of Mn, 0 to 1 wt. % of Cr, 0 to 1 wt. % of Ge, 0 to 1 wt. % of Fe, 0 to 1 wt. % of Al, 0 to 1 wt. % of P, 0 to 1 wt. % of Au, 0 to 3 wt. % of Ga, 0 to 1 wt. % of Te, 0 to 1 wt. % of Se, 0 to 1 wt. % of Ca, 0 to 1 wt. % of V, 0 to 1 wt. % of Mo, 0 to 1 wt. % of Pt, 0 to 1 wt. % of Mg, 0 to 1 wt. % of rare earths, and the balance tin, together with any unavoidable impurities.

In accordance with one or more embodiments, a thermosetting cross-linkable flux containing epoxy resin, a phenolic hardening agent, and a phosphine salt catalyst may be used to catalyze the hardening process of epoxy resin. In at least some embodiments, the thermosetting flux is a substantially rosin-free thermosetting flux for electronic soldering.

In accordance with one or more embodiments, a thermosetting curable polymer flux containing epoxy resin, a phenolic hardener, and a phosphine salt catalyst may be used to catalyze the hardening process of epoxy resin. The flux may be stable at room temperature for more than two weeks which is generally favorable for the manufacture of electronic devices.

In accordance with one or more embodiments, a flux formulation may include an organic solvent for epoxy resin. Any high boiling organic solvent may be used which generally dissolves epoxy resin. Most of the organic solvents which dissolve epoxy resin are generally low boiling in nature. In some examples, solvents from ether such as tripropylene glycol monobutyl ether may be selected. A typical weight percent of solvent in the final formulation may be in the range of about 20% to about 40%.

In accordance with one or more embodiments, a flux formulation may include a liquid and a solid epoxy resin. A formulation may also include a hardening agent. A bi-, tri-, or tetra-/multi-functional type liquid and a solid epoxy may be used. A favorable viscosity may be achieved by having both liquid and solid epoxy in the formulation. A typical weight percent for epoxy in the final formulation may be in the range of about 30% to about 60%.

In accordance with one or more embodiments, a flux formulation may include an organic acid. In some embodiments, the organic acid may be mono-carboxylic or di-carboxylic to help remove an oxide layer on the surface of the soldering substrate. These may be referred to as activators present in the flux. A typical weight percentage for organic activators in the final formulation may be in the range of about 10% to about 20%.

In accordance with one or more embodiments, a flux formulation may include one or more stress modifiers to reduce the modulus of the final cured material. The stress modifiers may generally be thermoplastic in nature. One non-limiting example may be high impact polystyrene. The stress modifiers should generally be compatible with the type of epoxy resin used in the formulation. A typical weight percentage for the stress modifiers in the final formulation may be about 1% to about 6%.

In accordance with one or more embodiments, a flux formulation may include one or more accelerators or catalysts. The accelerators may generally speed the cross-linking reaction between the epoxy and the hardening agent. In some embodiments, aromatic amine substituted compounds may be used. A typical weight percentage for the accelerators in the final formulation may be about 2% to about 10%. An accelerator or catalyst may generally be selected to trigger a cross-linking reaction of epoxy resin after alloy melts in a solder paste. In some embodiments, a blocked catalyst can be employed to achieve better soldering performance of high temperature alloys.

In accordance with one or more embodiments, a flux formulation may include one or more coupling agents to generally promote adhesion. Increasing the adhesion or bonding between epoxy resin and alloy may in turn increase the adhesion of cured epoxy fillet to the solder joint and the printed circuit board. In some non-limiting embodiments, a silane or titanate based coupling agent may be used to fulfill this requirement.

In some non-limiting embodiments, a flux formulation may include or essentially consist of the following generalized formulation:
  Organic high boiling solvents 20-40 wt %;
  Multi-functional type epoxy resin 5-15 wt %;
  Epoxy resin with high molecular weight 15-30 wt %;
  Phenolic group containing hardening agent 15-30 wt %;
  Carboxylic acid as an activator 10-20 wt %;
  Substituted aromatic amine as catalyst 2-8 wt %;
  Phosphene based salt as catalyst 1-5 wt %; and
  Liquid type stress modifier 0.1 to 4 wt %.

In some non-limiting embodiments, a formulation may include or essentially consist of the generalized formula described above along with one or more of the following:
  Anhydride based liquid hardener 2-6 wt %;
  Amide based catalyst 0.1-2 wt %; and
  Bonding agent 0.1-2 wt %.

In accordance with one or more embodiments, the components of the formulation may be mixed in a desired ratio. The mixture may be subjected to milling. In some embodiments, a FOG of less than 10 microns may be achieved before milling is terminated. The resulting flux may be mixed with a desired amount of soldering material in the form of fine powder.

Turning to the figures, FIG. 1 shows an assembly 10 including a conventional solder joint 13. A stress line 18 along a brittle intermetallic compound (IMC) layer 15 may contribute to the damage or failure of a solder joint 13 in an electronic device accidentally dropped.

Figure 2:
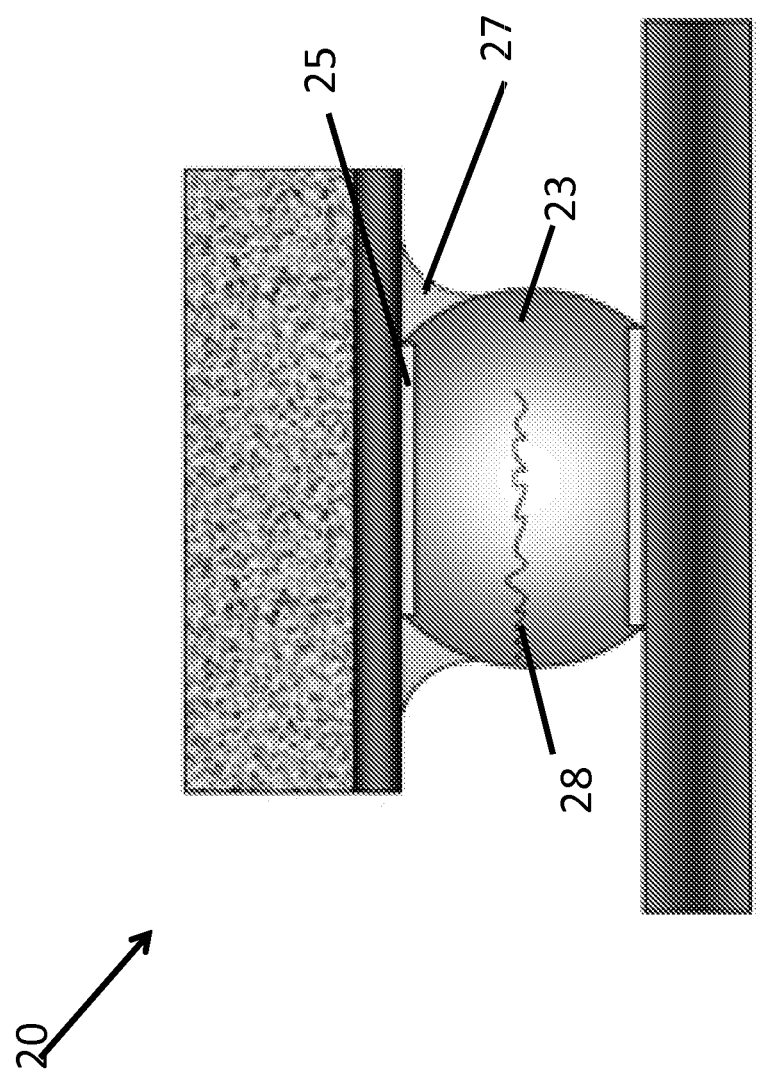
FIG. 2 is a schematic representation of a solder joint, in accordance with one or more embodiments.

In accordance with one or more embodiments, FIG. 2 presents a schematic of an assembly 20 with a solder joint 13 including an epoxy collar 17 in accordance with one or more embodiments. A thermosetting cross-linkable polymer used in a solder paste or other solder joining material forms a polymer collar 27 around the solder joint 23. The polymer collar 27 may direct stress 28 away from the brittle IMC layer 25 and equally distribute it to the bulk solder region 23, thereby mitigating the likelihood of failure because the bulk solder 23 generally has higher mechanical reliability properties. The shape and height of polymer collar 27 is not limited to that shown in FIG. 2. Instead, any defined shape and height may enhance the mechanical reliability of the solder joint 23.

Figure 3:
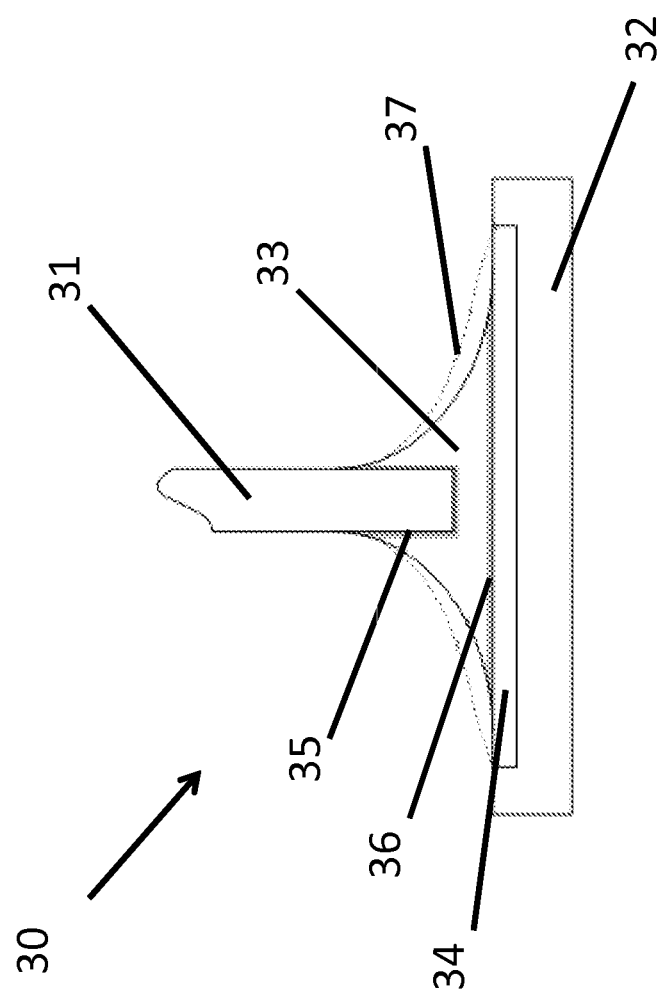
FIG. 3 is a schematic representation of a solder joint, in accordance with one or more embodiments.

In accordance with one or more embodiments, FIG. 3 shows a schematic view of a cross-section of an assembly 30 having a solder joint 33 between an electronic component 31, and a printed circuit board 32. Such a solder joint 33 is obtained upon solidification of a solder paste (a mixture in defined proportions of flux and solder powder) that is printed on the copper pad 34 on top of the PCB 32. Intermetallic compounds (IMCs) 35 are formed at the interface between the solder joint and the electronic component, while IMCs 36 are formed between the solder joint and the copper pad. The epoxy paste 37 surrounds the solder and, upon curing, improves the solder joint adhesion to the substrate and protects it from mechanical shock and vibration. The epoxy collar 37 acts as a reinforcement of the solder joint 33, protecting it against impact and mechanical shock that can be caused, for example, by a fall.

Figure 4:
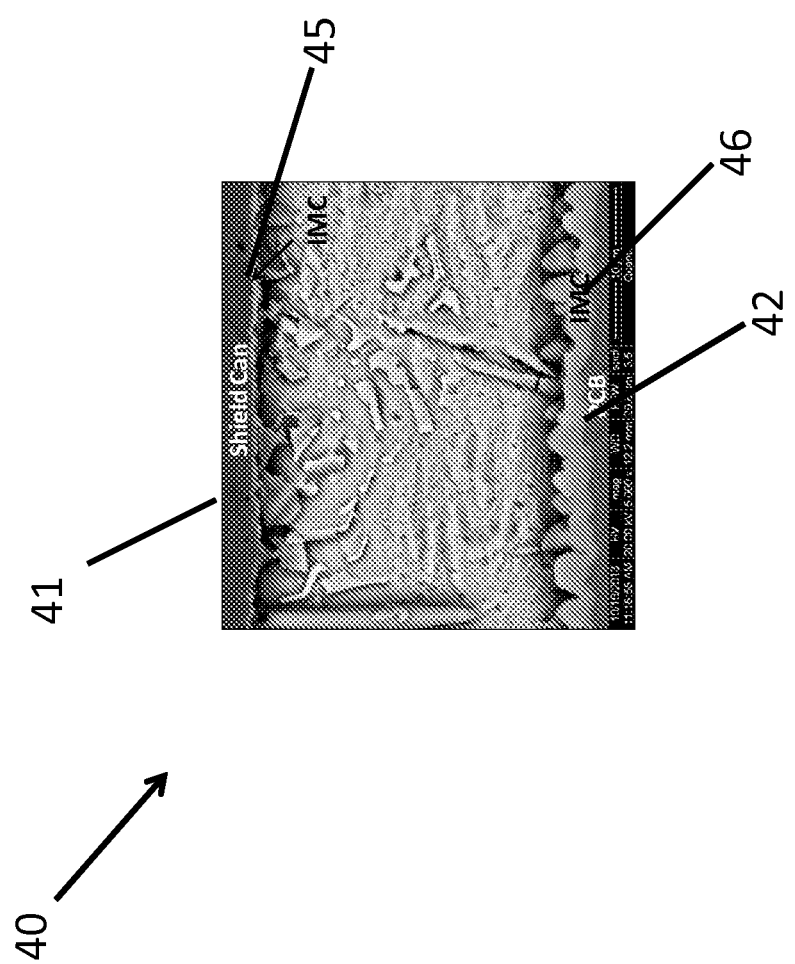
FIG. 4 is a representation of a solder joint taken from a scanning electron microscope, in accordance with one or more embodiments.

FIG. 4 shows an example of an actual cross-section of an assembly 40 observed using a scanning electron microscope. The IMCs 45 and 46 may result from interactions between the solder alloy and the substrate, in particular chemical bonding between the solder alloy and the surfaces of the substrates.

The epoxy solder paste may be applied in a number of manners. In accordance with one or more embodiments, it may be applied by dispensing and dipping. In accordance with one or more embodiments, it may be applied by printing, dispending and dipping. In accordance with one or more embodiments, the epoxy solder paste may be pre-applied for preforms. In accordance with one or more embodiments, the epoxy solder paste may be applied in solder film form. In accordance with one or more embodiments, the epoxy solder paste may be applied in film form.

In accordance with one or more embodiments, the disclosed epoxy paste comprising flux may be used in applications including, without limitation: surface mount technology, die and component attach, package on package, chip scale package, ball grid array, flip chip, shield can attachment, camera lens attachment, and solar modulus.

In some embodiments, an epoxy paste as described herein can be used to improve the interaction of the paste residue and an underfill material. The residue of the epoxy paste may be more compatible with an epoxy underfill. In at least some embodiments, the epoxy paste flux can be specifically designed to be compatible with the underfill. In some non-limiting embodiments, the epoxy paste flux may be the same as an underfill material. In accordance with one or more embodiments, the presently disclosed flux and solder paste materials and methods may be used in conjunction with dual side reinforcement (DSR) materials and methods such as those described in co-pending International PCT Application Serial No. PCT/US2014/049046 filed on Jul. 31, 2014 and titled DUAL SIDE REINFORCEMENT FLUX FOR ENCAPSULATION which is hereby incorporated herein by reference in its entirety for all purposes.

The function and advantages of these and other embodiments will be more fully understood from the following examples. The examples are intended to be illustrative in nature and are not to be considered as limiting the scope of the embodiments discussed herein.

EXAMPLES

The following general alloy formulations are referenced throughout the below examples:
57.8 Bi, 0.01-0.06 Co, 0.1-0.3 Cu (alloy A),
56 Bi, 0.3-0.6 Cu, 0.01-0.06 Co (alloy B),
56 Bi, 0.2-0.6 Ag, 0.3-0.6 Cu, 0.001-0.006 Co (alloy C),
38 Bi, 0.8-1.2 Ag, 0.01-0.06 Co, 0.1-0.3 Cu (alloy D),
58 Bi, 2.7-3.3 Ag, 0.01-0.06 Co, 0.1-0.3 Cu (alloys E),
55 Bi, 2.7-3.3 Ag, 0.01-0.06 Co, 0.1-0.3 Cu (alloys F),
38 Bi, 0.3-0.9 Ag, 0.005-0.02 Mn, 0.1-0.3 Cu (alloy G),
58 Bi, 0.2-0.8 Ag, 0.2-0.8 In (alloy H),
58 Bi, 0.7-1.3 Ag, 0.7-1.3 In, 0.001-0.01 Ge (alloy I),
58 Bi, 0.7-1.3 Ag, 0.7-1.3 In, 0.01-0.06 Co, 0.1-0.3 Cu (alloy J), and
38 Bi, 0.7-1.3 Ag, 0.001-0.01 Mn (alloy K)

Example 1

A drop shock test was performed to test the mechanical properties of formed solder joints. The test was performed in general accordance with the JESD22-B111 standard, with the variation that the BGA components were replaced by shield cans. The drop shock performance of the solder joint is reflected in the number of drops that the tested assembly sustains prior to failure of the solder joint.

Figure 5:
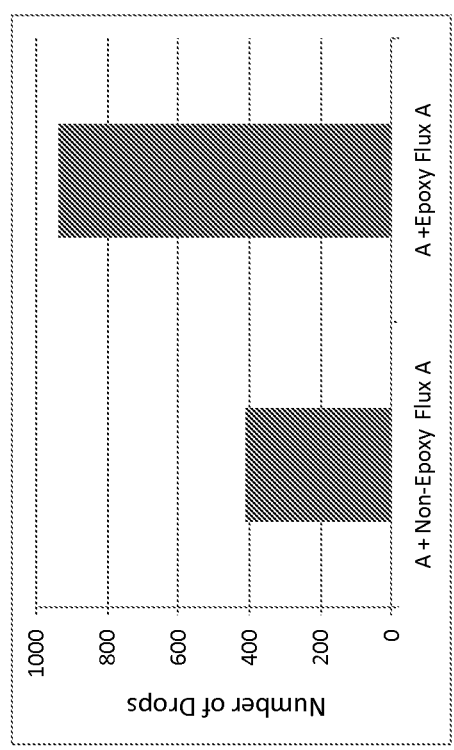
FIG. 5 is a graph depicting the results of drop tests discussed in the accompanying Examples.

The results of the test are shown in FIG. 5. When alloy A, which has a melting point of approximately 138° C., is mixed with non-epoxy flux A the number of drops before the shield fails the drop shock test is about 400. By mixing the same alloy A with epoxy flux C, as disclosed herein, the number of drops increases to above 900.

Therefore, the drop shock performance can be improved by means of alloying additions and by use of the disclosed formulations of epoxy solder pastes.

Example 2

A bending test was performed to test the mechanical properties of formed solder joints. The bending performance of the solder joint is reflected in the number of bending cycles the assembly sustains prior to failure.

Figure 6:
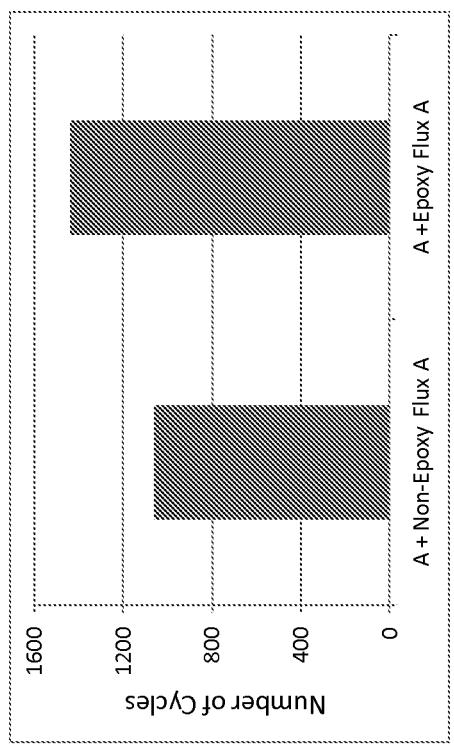
FIG. 6 is a graph depicting the results of bending tests discussed in the accompanying Examples.

The results of the test are shown in FIG. 6. When alloy A is mixed with non-epoxy flux A the number of bending cycles before the shield can fails the impact bending test is 1060. By mixing the same alloy A with epoxy flux C the number of bending cycles increases to 1440.

Therefore, impact bending properties can also be improved by means of alloying additions and by using certain formulations of epoxy solder pastes.

Example 3

A second battery of drop shock tests were performed in which various alloy compositions A, B, C, D, E, F, G, H, I, J, K and L are mixed with epoxy flux C.

Figure 7:
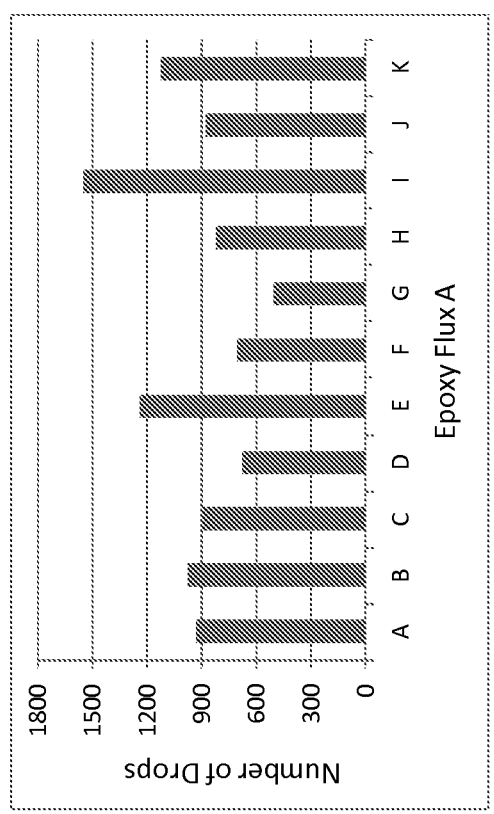
FIG. 7 is a graph depicting the results of drop tests discussed in the accompanying Examples.

FIG. 7 shows the drop shock test results. Each of the resulting epoxy solder pastes have higher drop shock performance than of the non-epoxy flux A mixed with alloy A, discussed in Example 1, thereby demonstrating a compatibility between alloy and flux.

Example 4

A second battery of bending tests were performed in which various alloy compositions A, D, E, F, G, H, I, J, K and L are mixed with epoxy flux C.

Figure 8:
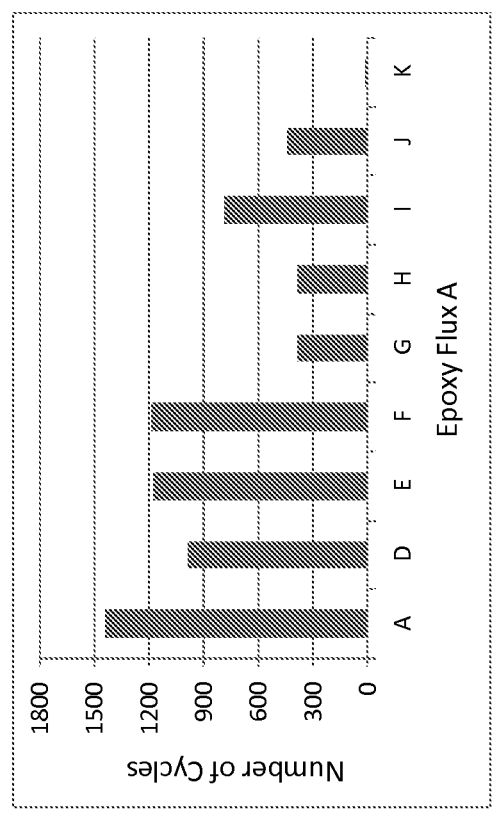
FIG. 8 is a graph depicting the results of bending tests discussed in the accompanying Examples.

FIG. 8 shows the results of the impact bending tests. The number of bending cycles of alloys A, E and F are higher than of the non-epoxy flux A mixed with alloy A, discussed with regard to Example 1. However, alloys D, G, H, I, J and K showed lower impact bending properties.

Example 5

A third battery of drop shock tests were performed in which various epoxy fluxes A, B, C, D, and E are mixed with alloy A.

Figure 9:
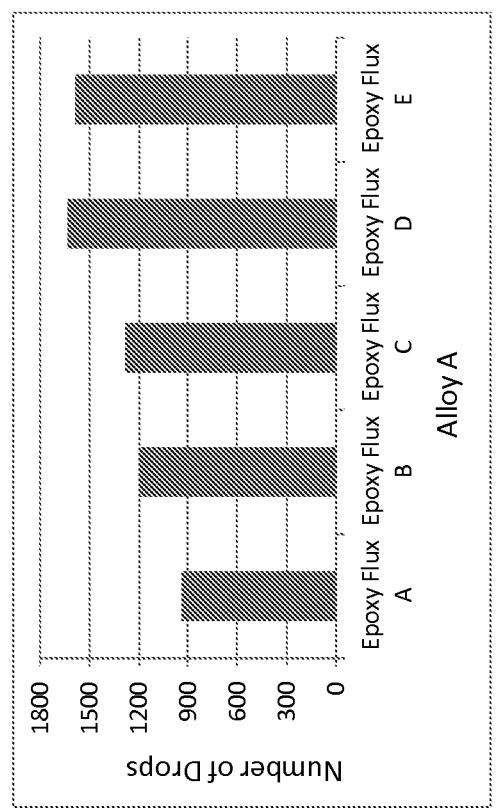
FIG. 9 is a graph depicting the results of drop tests discussed in the accompanying Examples.

The results are shown in FIG. 9. These results demonstrate a considerable increase of drop shock properties of alloy A by modifying the epoxy flux chemistry.

Example 6

A third battery of bending tests were performed in which various epoxy fluxes A, B, C, D, and E are mixed with alloy A.

Figure 10:
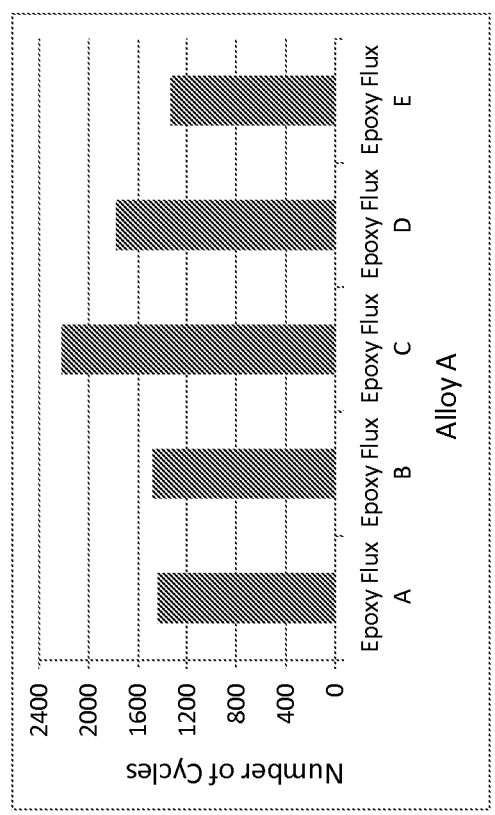
FIG. 10 is a graph depicting the results of bending tests discussed in the accompanying Examples.

The results are shown in FIG. 10. These results demonstrate how these new epoxy flux chemistries result in improved impact bending properties over the epoxy solder paste of alloy A and epoxy flux A.

It is to be appreciated that embodiments of the compositions and methods discussed herein are not limited in application to the details of construction and the arrangement set forth herein. The compositions and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A flux for an epoxy solder paste, the flux comprising:
   20 to 40% by weight organic high-boiling solvents;
   5 to 15% by weight multi-functional type epoxy resin;
   15 to 30% by weight epoxy resin with high molecular weight;
   15 to 30% by weight phenolic group containing hardening agent;
   2 to 6% by weight anhydride based liquid hardener;
   10 to 20% by weight carboxylic acid as an activator;
   2 to 8% by weight substituted aromatic amine as catalyst;
   1 to 5% by weight phosphene based salt as catalyst;
   0.1 to 2% by weight amide based catalyst;
   0.1 to 2% by weight bonding agent; and
   0.1 to 4% by weight liquid type stress modifier.

2. The flux of claim 1, wherein the organic high-boiling solvent comprises an ether.

3. An epoxy solder paste comprising an alloy and a flux, the flux comprising:
   20 to 40% by weight organic high-boiling solvents;
   5 to 15% by weight multi-functional type epoxy resin;
   15 to 30% by weight epoxy resin with high molecular weight;
   15 to 30% by weight phenolic group containing hardening agent;
   2 to 6% by weight anhydride based liquid hardener;
   10 to 20% by weight carboxylic acid as an activator;
   2 to 8% by weight substituted aromatic amine as catalyst;
   1 to 5% by weight phosphene based salt as catalyst;
   0.1 to 2% by weight amide based catalyst;
   0.1 to 2% by weight bonding agent; and
   0.1 to 4% by weight liquid type stress modifier.

4. The epoxy solder paste of claim 3, wherein the alloy comprises:
   30 to 65% by weight bismuth; and
   balance tin, together with unavoidable impurities.

5. The epoxy solder paste of claim 4, wherein the alloy further includes one or more of the following components:
   silver, gold, chromium, indium, phosphorous, copper, cobalt, germanium, manganese, nickel, zinc, titanium, gallium, iron, antimony, aluminum, tellurium, selenium, calcium, vanadium, molybdenum, platinum, and magnesium.

6. The epoxy solder paste of claim 5, wherein the alloy further includes:
   0.01 to 10% by weight silver; and
   0.01 to 10% by weight copper.

7. The epoxy solder paste of claim 6, the alloy further including one or more of the following:
   0.001 to 1% by weight cobalt;
   0.001 to 1% by weight nickel;
   0.001 to 3% by weight indium;
   0.001 to 4% by weight antimony;
   0.001 to 1% by weight titanium;
   0.001 to 3% by weight gallium;
   0.001 to 1% by weight manganese;
   0.001 to 1% by weight germanium;
   0.001 to 1% by weight zinc;
   0.001 to 1% by weight iron;
   0.001 to 1% by weight gold;
   0.001 to 1% by weight chromium;
   0.001 to 1% by weight phosphorous;
   0.001 to 1% by weight aluminum;
   0.001 to 1% by weight tellurium;
   0.001 to 1% by weight selenium;
   0.001 to 1% by weight calcium;
   0.001 to 1% by weight vanadium;

0.001 to 1% by weight molybdenum;
0.001 to 1% by weight platinum;
0.001 to 1% by weight magnesium; and
0.001 to 1% by weight rare earths.

8. The epoxy solder paste of claim 6, the alloy further including 0.001 to 1% by weight cobalt.

9. The epoxy solder paste of claim 6, the alloy further including 0.001 to 1% by weight nickel.

10. The epoxy solder paste of claim 6, the alloy further including 0.001 to 3% by weight indium.

11. The solder paste of claim 3, wherein the alloy is configured to reflow at a soldering temperature below 200° C.

12. The solder paste of claim 11, wherein the alloy is configured to reflow at a soldering temperature between 118° C. and 200° C.

13. The solder paste of claim 12, wherein the alloy is configured to reflow at a soldering temperature between 170° C. and 200° C.

14. The solder paste of claim 3, wherein the solder paste imparts improved or enhanced solder joint properties relating to at least one of drop shock, thermal cycling, thermal shock, shear strength, flexural strength performance, and/or other thermal-mechanical performance attributes.

15. The epoxy solder paste of claim 3, wherein the alloy comprises:
    10% by weight or less silver;
    10% by weight or less bismuth;
    10% by weight or less indium;
    10% by weight or less copper; and
    balance tin, together with unavoidable impurities.

16. The epoxy solder paste of claim 15, the alloy further including one or more of the following components:
    gold, chromium, phosphorous, cobalt, zinc, germanium, manganese, nickel, titanium, gallium, iron, antimony, tellurium, aluminum, selenium, calcium, vanadium, molybdenum, platinum, magnesium, and rare earths.

17. The epoxy solder paste of claim 15, the alloy further including one or more of the following:
    0.001 to 1% by weight cobalt;
    0.001 to 1% by weight nickel;
    0.001 to 4% by weight antimony;
    0.001 to 1% by weight titanium;
    0.001 to 3% by weight gallium;
    0.001 to 1% by weight manganese;
    0.001 to 1% by weight germanium;
    0.001 to 1% by weight zinc;
    0.001 to 1% by weight iron;
    0.001 to 1% by weight gold;
    0.001 to 1% by weight chromium;
    0.001 to 1% by weight phosphorous;
    0.001 to 1% by weight aluminum;
    0.001 to 1% by weight tellurium;
    0.001 to 1% by weight selenium;
    0.001 to 1% by weight calcium;
    0.001 to 1% by weight vanadium;
    0.001 to 1% by weight molybdenum;
    0.001 to 1% by weight platinum;
    0.001 to 1% by weight magnesium; and
    0.001 to 1% by weight rare earths.

18. The epoxy solder paste of claim 3, wherein the alloy comprises:
    10% by weight or less silver;
    10% by weight or less copper; and
    the balance tin, together with any unavoidable impurities.

19. The epoxy solder paste of claim 18, the alloy further including one or more of the following:
    10% by weight or less bismuth;
    1% by weight or less nickel;
    1% by weight or less titanium;
    1% by weight or less cobalt;
    5% by weight or less indium;
    1% by weight or less zinc;
    1% by weight or less arsenic;
    1% by weight or less manganese;
    1% by weight or less chromium;
    1% by weight or less germanium;
    1% by weight or less iron;
    1% by weight or less aluminum;
    1% by weight or less phosphorous;
    1% by weight or less gold;
    1% by weight or less gallium;
    1% by weight or less tellurium;
    1% by weight or less selenium;
    1% by weight or less calcium;
    1% by weight or less vanadium;
    1% by weight or less molybdenum;
    1% by weight or less platinum;
    1% by weight or less magnesium; and
    1% by weight or less rare earths.

20. The epoxy solder paste of claim 3, wherein the alloy comprises at least one of:
    10% by weight or less silver; and
    10% by weight or less copper.

21. The epoxy solder paste of claim 20, the alloy further including one or more of the following
    10% by weight or less bismuth;
    1% by weight or less nickel;
    1% by weight or less titanium;
    1% by weight or less cobalt;
    5% by weight or less indium;
    1% by weight or less zinc;
    1% by weight or less arsenic;
    1% by weight or less manganese;
    1% by weight or less chromium;
    1% by weight or less germanium;
    1% by weight or less iron;
    1% by weight or less aluminum;
    1% by weight or less phosphorous;
    1% by weight or less gold;
    1% by weight or less gallium;
    1% by weight or less tellurium;
    1% by weight or less selenium;
    1% by weight or less calcium;
    1% by weight or less vanadium;
    1% by weight or less molybdenum;
    1% by weight or less platinum;
    1% by weight or less magnesium; and
    1% by weight or less rare earths.

22. A solder joint formed with an epoxy solder paste, the epoxy solder paste comprising an alloy and a flux, the flux comprising:
    20 to 40% by weight organic high-boiling solvents;
    5 to 15% by weight multi-functional type epoxy resin;
    15 to 30% by weight epoxy resin with high molecular weight;
    15 to 30% by weight phenolic group containing hardening agent;
    2 to 6% by weight anhydride based liquid hardener;
    10 to 20% by weight carboxylic acid as an activator;
    2 to 8% by weight substituted aromatic amine as catalyst;
    1 to 5% by weight phosphene based salt as catalyst;

0.1 to 2% by weight amide based catalyst;
0.1 to 2% by weight bonding agent; and
0.1 to 4% by weight liquid type stress modifier.

23. A method of forming a solder joint with an epoxy solder paste, the epoxy solder paste comprising an alloy and a flux, the flux comprising:
   20 to 40% by weight organic high-boiling solvents;
   5 to 15% by weight multi-functional type epoxy resin;
   15 to 30% by weight epoxy resin with high molecular weight;
   15 to 30% by weight phenolic group containing hardening agent;
   2 to 6% by weight anhydride based liquid hardener;
   10 to 20% by weight carboxylic acid as an activator;
   2 to 8% by weight substituted aromatic amine as catalyst;
   1 to 5% by weight phosphene based salt as catalyst;
   0.1 to 2% by weight amide based catalyst;
   0.1 to 2% by weight bonding agent; and
   0.1 to 4% by weight liquid type stress modifier;
      wherein the method comprises the step of applying the solder paste to a substrate.

24. The method of claim 23, wherein the solder paste imparts improved or enhanced solder joint properties relating to at least one of drop shock, thermal cycling, thermal shock, shear strength, flexural strength performance, and/or other thermal-mechanical performance attributes.

25. An assembly comprising a printed circuit board, a shield can, and a solder joint formed between the printed circuit board and the shield can, wherein the solder joint is formed by an epoxy solder paste comprising an alloy and a flux, the flux comprising:
   20 to 40% by weight organic high-boiling solvents;
   5 to 15% by weight multi-functional type epoxy resin;
   15 to 30% by weight epoxy resin with high molecular weight;
   15 to 30% by weight phenolic group containing hardening agent;
   2 to 6% by weight anhydride based liquid hardener;
   10 to 20% by weight carboxylic acid as an activator;
   2 to 8% by weight substituted aromatic amine as catalyst;
   1 to 5% by weight phosphene based salt as catalyst;
   0.1 to 2% by weight amide based catalyst;
   0.1 to 2% by weight bonding agent; and
   0.1 to 4% by weight liquid type stress modifier.

26. The assembly of claim 25, wherein the printed solder board further comprises a copper pad.

27. The assembly of claim 26, further comprising intermetallic compounds formed at an interface between the solder joint and the shield can and between the solder joint and the copper pad.

28. The assembly of claim 25, wherein the assembly is configured to withstand at least 900 drops in a drop shock test performed under a variation of the JESD22-B111 standard in which BGA components are replaced by shield cans.

* * * * *